(12) United States Patent
Chang et al.

(10) Patent No.: US 7,569,910 B2
(45) Date of Patent: Aug. 4, 2009

(54) MULTIPLE-TRANSISTOR STRUCTURE SYSTEMS AND METHODS IN WHICH PORTIONS OF A FIRST TRANSISTOR AND A SECOND TRANSISTOR ARE FORMED FROM THE SAME LAYER

(75) Inventors: Mauchung (Frank) Chang, Los Angeles, CA (US); Peiming (Daniel) Chow, Los Angeles, CA (US); Liyang Zhang, West Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 269 days.

(21) Appl. No.: 11/514,090

(22) Filed: Aug. 30, 2006

(65) Prior Publication Data

US 2008/0054305 A1    Mar. 6, 2008

(51) Int. Cl.
*H01L 29/732* (2006.01)
*H01L 29/735* (2006.01)
*H01L 29/737* (2006.01)
*H01L 21/8224* (2006.01)

(52) U.S. Cl. .................... 257/565; 257/E27.054; 257/E21.609; 257/273; 257/197; 438/336

(58) Field of Classification Search ........ 257/183–183.1, 257/197–199, 202–206, 566–567, E27.064, 257/E21.609; 438/336
See application file for complete search history.

(56) References Cited

U.S. PATENT DOCUMENTS

| 5,508,553 A * | 4/1996 | Nakamura et al. ........... 257/576 |
| 6,462,362 B1 * | 10/2002 | Miyoshi ..................... 257/198 |
| 2003/0045112 A1 * | 3/2003 | Vass et al. .................... 438/705 |
| 2003/0219952 A1 * | 11/2003 | Fujimaki ..................... 438/322 |

FOREIGN PATENT DOCUMENTS

| JP | 62-262513 | 11/1987 |
| JP | 1-198068 | 8/1989 |
| JP | 7-094593 | 4/1995 |
| JP | 411214937 A * | 8/1999 |

OTHER PUBLICATIONS

Ng, Complete Guide to Semiconductor Devices 2nd Edition, Bipolar Transistor, 34.5.1 Heterojunction Bipolar Transistor, 2000, pp. 279-280.*
Official Office Action Letter dated Jul. 31, 2008 in counterpart Korean application (Application No. 2007-0085401), with English language translation.

* cited by examiner

*Primary Examiner*—David Vu
*Assistant Examiner*—Earl N Taylor
(74) *Attorney, Agent, or Firm*—DLA Piper LLP (US)

(57) ABSTRACT

A semiconductor structure is fabricated with two different portions. The first portion forms a first transistor, while the second portion forms a second transistor. Notably, portions of the first transistor also a make up portions of the second transistor. That is, both the first transistor and the second transistor are made of portions of the same structure.

29 Claims, 5 Drawing Sheets

| | | |
|---|---|---|
| n+ InGaAs/GaAs | 120 | Emitter contact layer ((Npn) |
| N- InGaP | 110 | Emitter layer ((Npn) |
| Collector (pnp) Emitter (pnp) p+ GaAs | 50 | Base layer (Npn) |
| Base (pnp) n- GaAs | 40 | Collector layer (Npn) |
| Base contact (pnp) n+ GaAs | 30 | Collector contact layer (Npn) |
| Semi-insulating GaAs Substrate | 20 | |

FIG. 3

| | | | |
|---|---|---|---|
| 210 | | | |
| 200 | E$\mathrm{^{130}_{Npn}}$ | | |
| n+ InGaAs/GaAs | 120 | Emitter contact layer (Npn) | |
| N- InGaP | 110 | Emitter layer (Npn) | |
| Emitter (pnp) p+ GaAs | 50 | Base layer (Npn) | |
| Base (pnp) n- GaAs | 40 | Collector layer (Npn) | |
| Base contact (pnp) n+ GaAs | 30 | Collector contact layer (Npn) | |
| Semi-insulating GaAs Substrate | 20 | | |

FIG. 4

MULTIPLE-TRANSISTOR STRUCTURE SYSTEMS AND METHODS IN WHICH PORTIONS OF A FIRST TRANSISTOR AND A SECOND TRANSISTOR ARE FORMED FROM THE SAME LAYER

BRIEF DESCRIPTION OF THE INVENTION

This invention relates generally to transistors. More specifically, this invention relates to semiconductor structures that share the same semiconductor epitaxial structures.

BACKGROUND OF THE INVENTION

As device and circuit density increases, it has become increasingly desirable to design and fabricate multi-purpose semiconductor structures whose parts can function as more than one device. These structures allow for increased device density and/or circuit functionality, as multiple devices can be fabricated within a single such structure. Accordingly, continuing efforts exist to design and develop multi-purpose semiconductor structures such as structures having multiple transistors.

SUMMARY OF THE INVENTION

The invention can be implemented in numerous ways, including as an apparatus and as a method. Several embodiments of the invention are discussed below.

In one embodiment, a transistor structure comprises a first transistor having a base portion and an emitter portion, and a second transistor having a base and a collector. The emitter portion of the first transistor is further configured as the base of the second transistor, and the base portion of the first transistor is further configured as the collector of the second transistor.

In another embodiment, a semiconductor device comprises a first $n^+$ semiconductor layer, a second $n^-$ semiconductor layer fabricated upon the first $n^+$ semiconductor layer, and a third $p^+$ semiconductor layer fabricated upon the second $n^-$ semiconductor layer, and having a first portion placed at a distance from a second portion.

In another embodiment, a switch circuit comprises a first terminal configured for electrical connection to a voltage source, a second terminal configured for electrical connection to a power amplifier, a first switch transistor configured to control an application of a voltage from the voltage source to the power amplifier according to a switch signal, and a second switch transistor configured to control an application of the switch signal to the first switch transistor according to a shutdown current. At least one n-doped semiconductor layer comprises a base of the first switch transistor and a collector of the second transistor. Also, a p-doped semiconductor layer comprises a collector and an emitter of the first switch transistor, and a base of the second switch transistor.

In another embodiment, a method of fabricating a semiconductor device comprises fabricating a first $n^+$ semiconductor layer, a second $n^-$ semiconductor layer upon the first $n^+$ semiconductor layer, and a third $p^+$ semiconductor layer upon the second $n^-$ semiconductor layer. The third $p^+$ semiconductor layer is etched to form an emitter of a first transistor, a collector of the first transistor, and a base of a second transistor. The second $n^-$ semiconductor layer and the first $n^+$ semiconductor layer are etched to form a base of the first transistor, and a collector of the second transistor.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention, together with further objects and advantages thereof, may best be understood by reference to the following description taken in conjunction with the accompanying drawings in which:

FIGS. 3-8 illustrate process steps in the fabrication of the structure of FIG. 1.

Like reference numerals refer to corresponding parts throughout the drawings. Also, it is understood that the depictions in the figures are diagrammatic and not necessarily to scale.

DETAILED DESCRIPTION OF EMBODIMENTS OF THE INVENTION

In one embodiment of the invention, a semiconductor structure is fabricated with two different portions. The first portion forms a first transistor, while the second portion forms a second transistor. Notably, portions of the first transistor also a make up portions of the second transistor. That is, both the first transistor and the second transistor are made of portions of the same structure.

Figure 1:
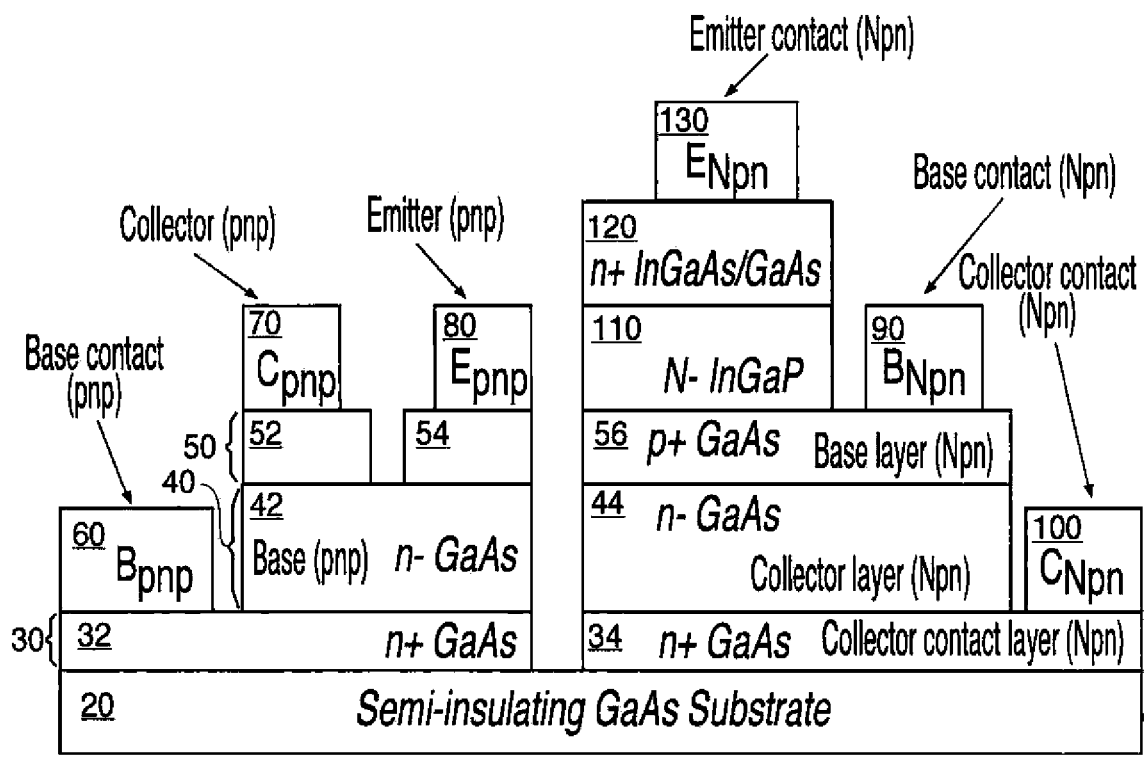
FIG. 1 illustrates a cutaway side view of a multiple transistor structure, fabricated according to an embodiment of the present invention.

FIG. 1 illustrates a cutaway side view of an exemplary semiconductor structure of the invention. Here, the semiconductor structure 10 is fabricated as a number of epitaxial layers built upon a substrate 20. In particular, a first layer 30 is fabricated in two sections 32, 34 as an $n^+$ semiconductor layer upon the substrate 20. A second layer 40 is fabricated in two sections 42, 44 as an $n^-$ semiconductor layer upon the first layer 30, and a third layer 50 is fabricated as a $p^+$ semiconductor layer upon the second layer 40, and etched into three different sections 52, 54, 56 as shown. Conductive contacts 60-100 can then be fabricated upon the first layer 30 and third layer 50, respectively. A fourth layer 110 is fabricated as an $N^-$ semiconductor layer upon the third layer 50 (where the capital N here indicates a heterojenction between different N- and p-doped semiconductor materials, e.g., between N-doped InGaP and p-doped GaAs layers), and a fifth layer 120 is fabricated as an $n^+$ semiconductor layer upon the fourth layer 110. Another contact 130 is fabricated atop the fifth layer 120. Each of the layers 30-50, 110-120 as well as the contacts 60-80, 130 can be fabricated according to known deposition, masking, and etching techniques.

With reference to FIG. 1, it can be seen that the particular construction of the structure 10 and layers 30-50, 110-120 comprise two separate semiconductor devices. In particular, the $n^+$ layer 30 and $n^-$ layer 40 collectively form a base portion of a transistor, with the two sections of the $p^+$ layer forming collector and emitter portions. In this manner, portions of the first layer 32, second layer 42, and two sections 52, 54 of the third layer 50 form a first transistor that is a pnp-type transistor extending generally radially, or laterally, through the structure 10. The conductive contacts 60-80 provide terminals for connecting this first transistor to external devices or circuits. That is, the contact 70 is a collector terminal for this first transistor, contact 80 is an emitter terminal, and contact 60 is a base terminal.

The structure 10 and layers 30-50, 110-120 also form a second transistor. More specifically, the n⁺ layer 34 and n⁻ layer 44, along with the p⁺ layer 56, and n-doped layers 10, 120 collectively form an additional heterogeneous Npn-type transistor. That is, in addition to forming the first laterally-extending transistor described above, layers 30-50 also form a portion of an additional vertically-extending transistor. In this manner, the layers 30-50 simultaneously form two different devices: one pnp-type transistor that extends generally laterally through the structure 10, and an additional Npn-type transistor that extends more vertically through the structure 10.

One of ordinary skill in the art will observe that the layers 30-50, 110-120 can be fabricated of any semiconductive materials suitable for simultaneously forming multiple transistors. In particular, the layers 30-50 can be n⁻- or n⁺-doped GaAs layers and layer 50 can be a p⁺-doped GaAs layer. However, it will be recognized that the invention encompasses other embodiments in which the layers can be traditional homogeneous Si or heterogeneous Si/SiGe, AlGaAs/GaAs, InGaP/GaAs, InP/InGaAs layers, or layers constructed of other group IV, III-IV, or II-VI compounds. The N⁻ layer 110 can be an InGaP semiconductor layer, and n⁺ layer 120 can be a composite or stacking InGaAs or GaAs layer, although one of ordinary skill in the art will realize that the layers 110, 120 can be fabricated from any semiconductor material(s) capable of forming an emitter. One of ordinary skill in the art will also observe that the structure 10 can be fabricated in a generally circular shape, or in any other shape capable of supporting both a complete transistor and an additional transistor portion.

Figure 2:
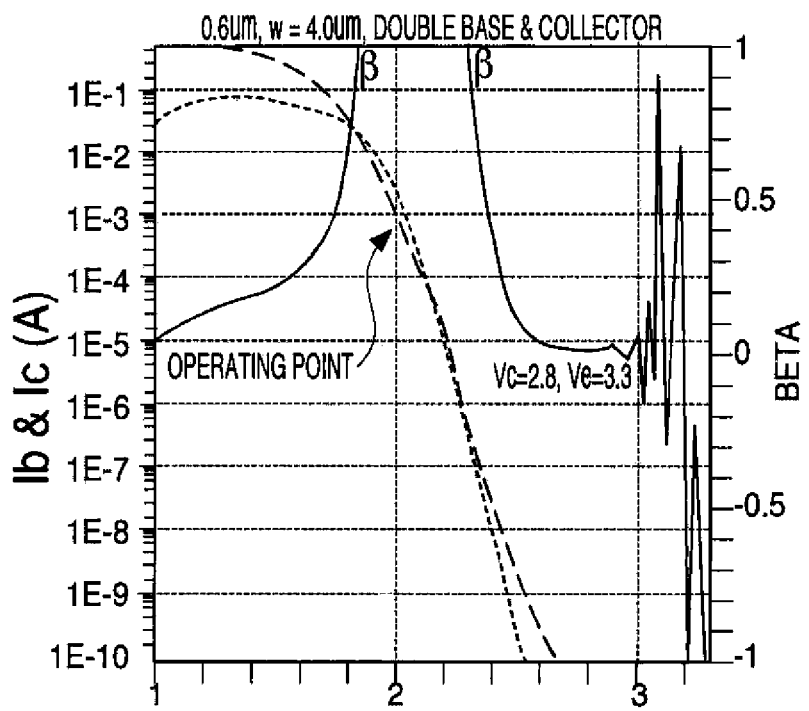
FIG. 2 illustrates simulated Gummel I-V characteristics of a lateral pnp homojunction bipolar transistor within the structure of FIG. 1.

FIG. 2 illustrates simulated Gummel I-V characteristics of the complete transistor (or first transistor) within the structure 10, where $I_c$ and $I_b$ represent the lateral transistor's collector and base currents, respectively, β represents the current gain of the transistor, $V_c$ is its collector bias voltage, $V_b$ its base bias voltage, and $V_e$ its emitter bias voltage. For these properties, it can be seen that the transistor can provide a current gain greater than 0.1 over a range of base bias voltages, which is sufficient for many circuit applications. Accordingly, and as will be seen in further detail below, transistors fabricated consistent with the invention can be used in many different circuit applications.

Figure 5:
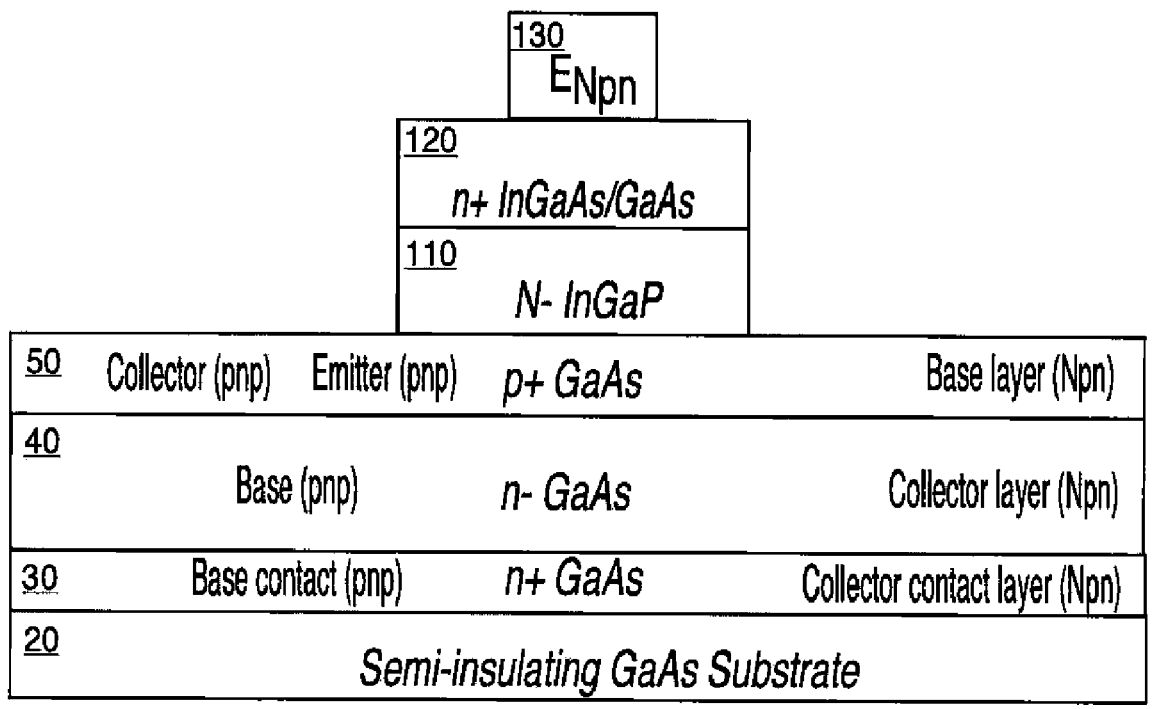
Figure 6:
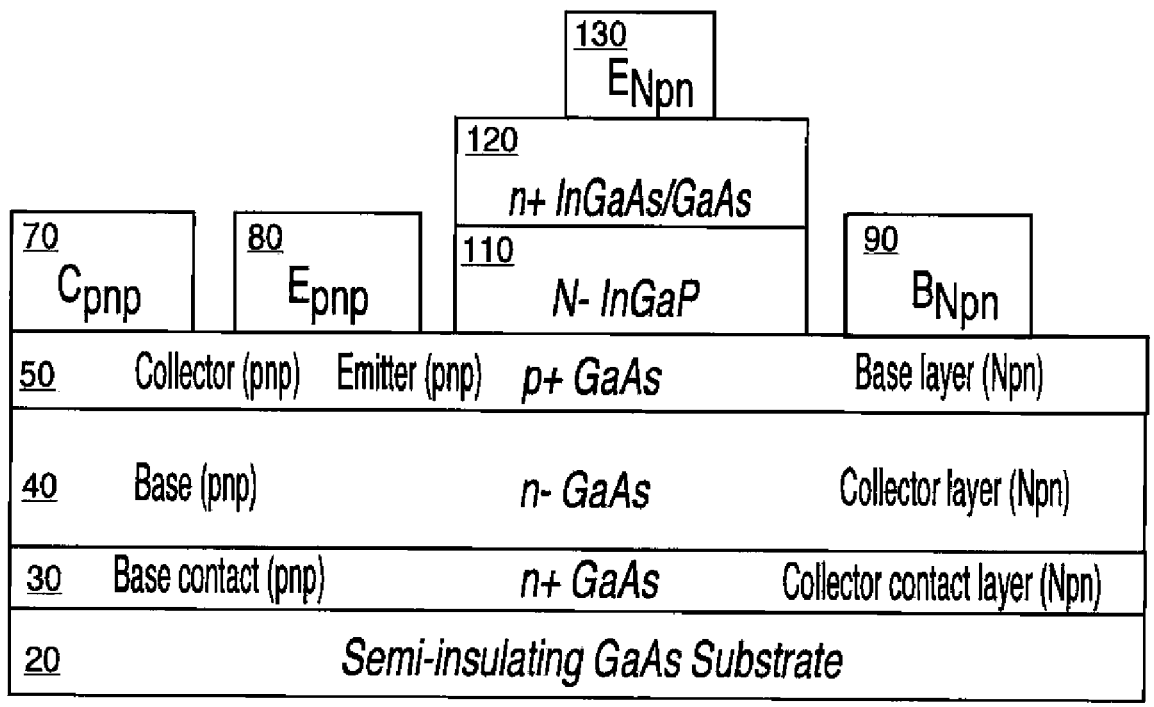
Figure 7:
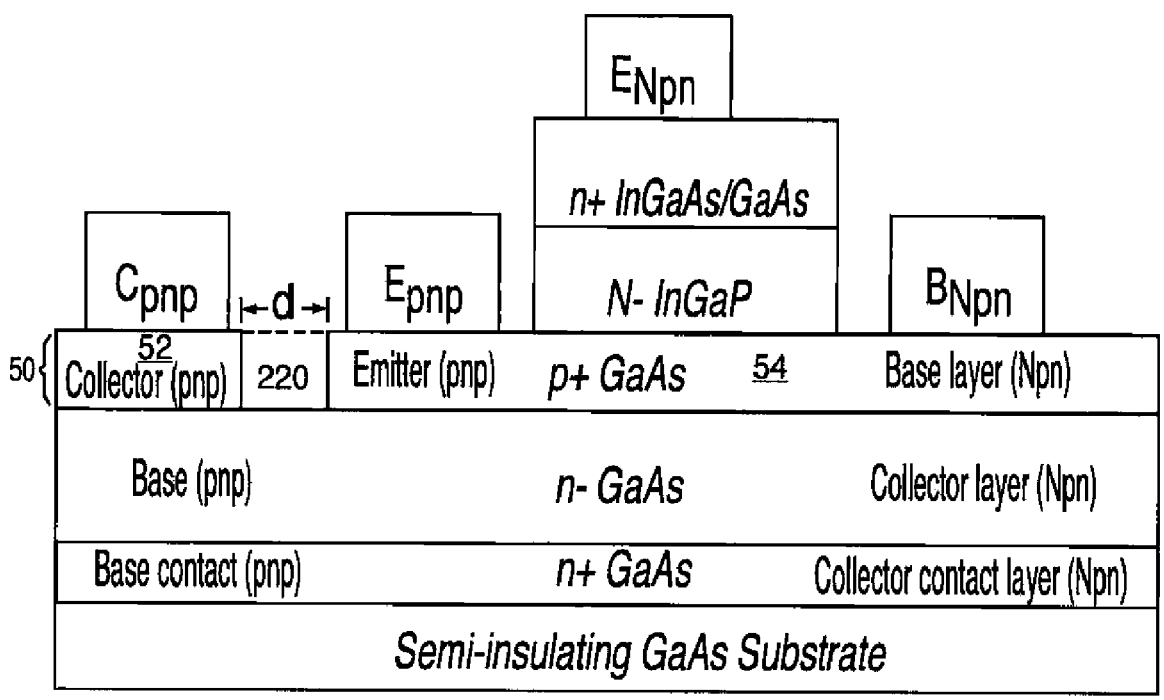
Figure 8:
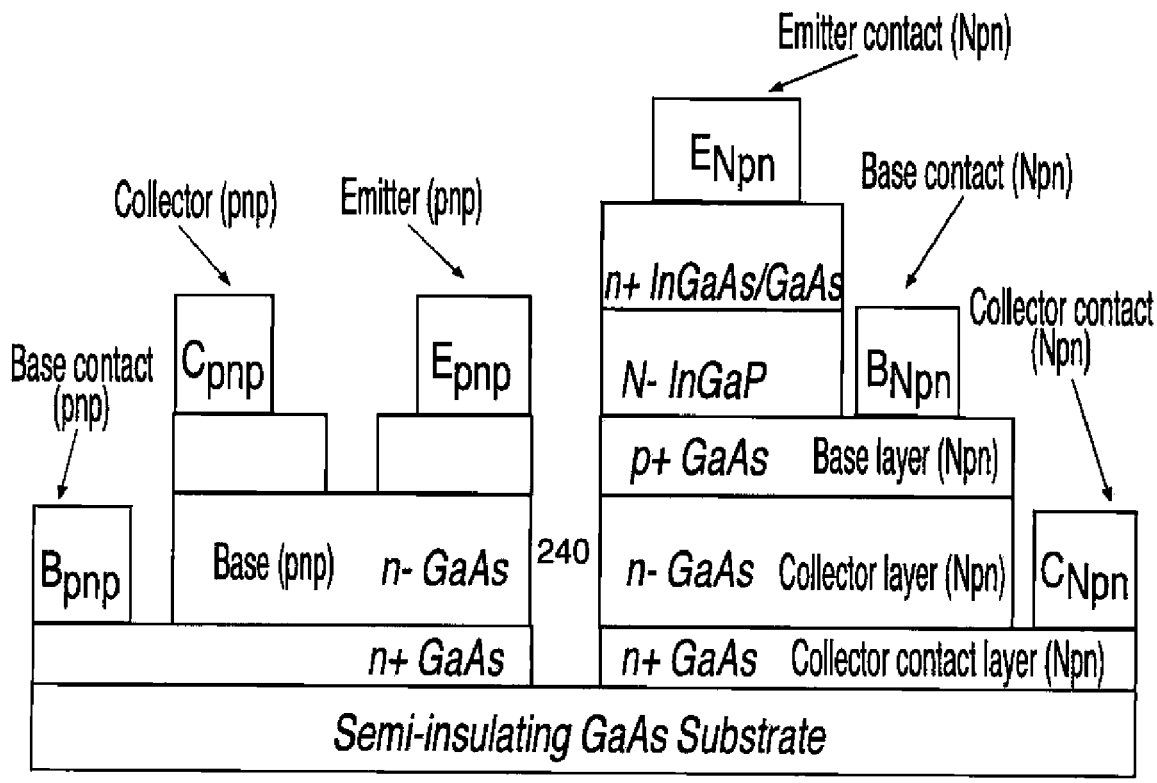

The structure and operation of semiconductor structure 10 having been explained, attention now turns to its fabrication. FIGS. 3-8 illustrate process steps in the fabrication of the structure 10. In the embodiment shown, a first n⁺ GaAs layer 30 is fabricated upon a substrate 20, followed by an n⁻ GaAs layer 40, and a p⁺ GaAs layer 50, as previously described above. To form the npn-type transistor, an additional N⁻ InGaP layer 110 is fabricated upon the layer 50, followed by an n⁺ InGaAs/GaAs layer 120 fabricated upon the N⁻ layer 110 (FIG. 3). These layers 110-120 form the emitter of the second transistor, with the layers 30, 40 forming the collector and layer 50 forming the base, as described above. To fabricate the structure 10, the top layer 120 is masked with a photoresist layer 200, and a refractory metal layer 210 is deposited to form contact 130 (FIG. 4). The remainder of the metal layer 210 is then lifted off along with the photoresist layer 200, leaving the contact 130 exposed. The contact 130 and portions of the layer 120 are then masked and etched, so as to expose the third layer 50. The mask is then removed from the contact 130 and layer 120 (FIG. 5). Following that, the third layer 50 is masked (not shown) to expose areas for the contacts 70-90, and another refractory metal layer (not shown) is deposited to form the contacts 70-90. This mask and refractory metal layer are then removed (FIG. 6). The third layer 50 is then masked to selectively expose a portion 220 of the third layer 50, and the portion 220 is etched away to form separate connector and emitter portions of the pnp-type transistor (FIG. 7). An isolation region 240 is then masked and etched away (FIG. 8), to electrically isolate the pnp-type transistor from the Npn-type transistor, allowing the two transistors to be operated simultaneously if desired.

It is known that the distance d between the collector 52 and emitter 54 influence the DC current gain of the pnp-type transistor, and the invention encompasses any masking and other fabrication steps necessary in fabricating a structure 10 having any appropriate distance d for achieving any desired DC current gain. In particular, as above, it is often desirable to fabricate such pnp-type transistors having a DC current gain of at least 0.1, corresponding to distances d that are comparable to the thickness of layer 40.

As above, it can be seen that this completed structure 10 has a generally laterally-arranged pnp-type first transistor with a collector terminal 70, emitter terminal 80, and base terminal 60. The collector terminal 70 is electrically connected to section 52 of the third layer 50, which is a p⁺ section that acts as the collector. The emitter terminal 80 is electrically connected to section 54 of the third layer 50, and is thus also a p⁺ section that acts as the emitter. Portions of first layer 32 and second layer 42 are electrically connected to each other and to portions of the third layer 52, 54, as well as to the contact 60, and collectively act as the base.

It can also be seen that some of the same portions of the structure 10 that make up this first laterally-arranged transistor also make up a portion of a second, generally vertically-arranged transistor. In particular, the same first layer 30 and second layer 40 that make up the base of the laterally-arranged pnp-type transistor can also make up the collector of a vertically-arranged Npn-type transistor. Also, the layer 50, in addition to acting as the emitter and collector of the pnp-type lateral transistor, can act as the base portion of an Npn-type vertical transistor. Together with an emitter portion formed by layers 110-120 and a collector portion formed by first layer 30, the structure 10 also includes a second, more vertically arranged, Npn-type transistor.

Figure 9:
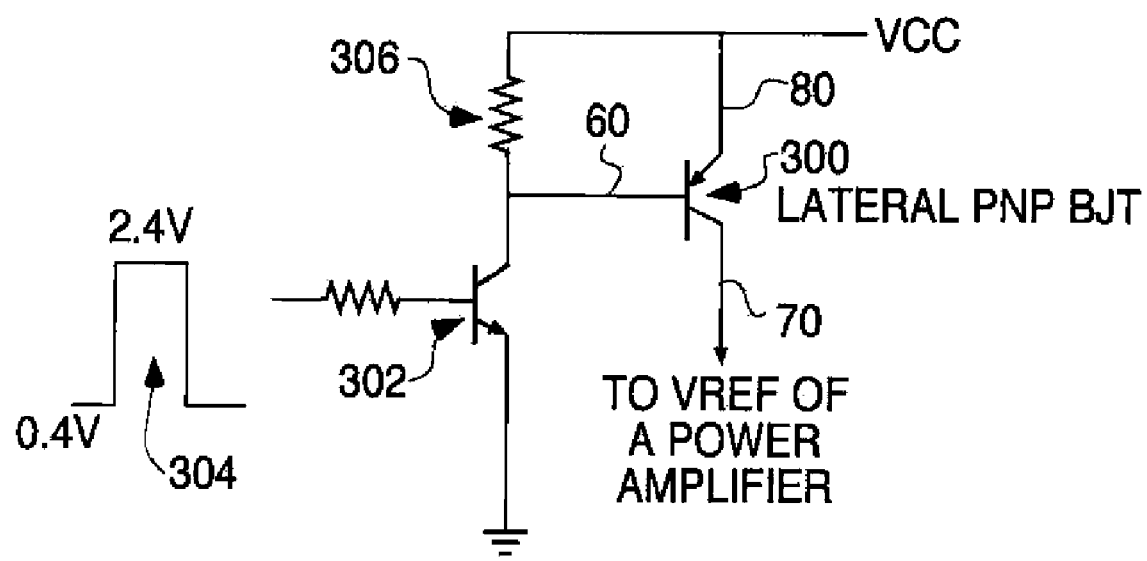
FIG. 9 illustrates an exemplary circuit employing transistors fabricated according to am embodiment of the present invention.

The structure 10 has many uses. For example, either the vertically-arranged transistor or the laterally-arranged transistor can be employed in many different applications. Indeed, for embodiments including the last fabrication step of FIG. 8, the two transistors can be electrically isolated and used simultaneously in the same circuit. FIG. 9 illustrates one example of an application of this laterally-arranged transistor, with the lateral transistor employed in a switch circuit to digitally switch on/off an RF/microwave power amplifier. Here, the lateral pnp-type transistor 300 is arranged as shown, with its emitter terminal 80 connected to a voltage source $v_{cc}$, its collector terminal 70 connected to a power amplifier for supplying a reference signal $v_{ref}$ for on/off switching, and its base terminal 60 connected to both $v_{cc}$ through a resistor 306 and to the collector terminal of the Npn-type transistor, which is used as a switch transistor 302. The circuit of FIG. 9 is a known switch circuit, which controls the application of $v_{cc}$ to the power amplifier according to a switch signal 304. More specifically, when the switch signal 304 is high (which is shown in this embodiment as 2.4 V but which can have any magnitude without deviating from the scope of the invention), the switch transistor 302 (i.e., the Npn-type transistor) bypasses the lateral transistor 300, and when the switch signal 304 is low, voltage $v_{ref}$ from the voltage source $v_{cc}$ is applied across the lateral transistor 300 to the power amplifier.

In this manner, the switch signal 304 controls the application of $v_{ref}$ to the power amplifier, providing a reference voltage for the switching on/off of the amplifier. It is known that a small current, referred to typically as a shutdown current, accompanies this reference voltage. In some embodiments of the switch circuit of FIG. 9, it is advantageous to configure the pnp-type transistor 300 so that the magnitude of the shutdown current is less than approximately 1 μA, as can be achieved when both emitter/base and base/collector junctions are properly reverse biased.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For example, the various layers of the structure 10 can be made of any materials that allow for a generally laterally-arranged transistor, portions of which can also act as the collector and base of another generally vertically-arranged transistor. The structure 10 can also be of any appropriate size or shape, and can include transistors capable of being employed in a variety of different applications, including but not limited to a switching circuit. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A transistor structure, comprising:
   a first lateral transistor having a base portion and an emitter portion; and
   a second vertical transistor having a base and a collector;
   wherein a first epitaxial region:
      serves both as the emitter portion of the first transistor and as the base of the second transistor, and
      forms a heterojunction with an emitter of the second transistor; and
   wherein a second epitaxial region serves both as the base portion of the first transistor and as the collector of the second transistor: and
   wherein the base portion of the first transistor further comprises an $n^+$ semiconductor layer and an $n^-$ semiconductor layer.

2. The transistor structure of claim 1 wherein the $n^+$ semiconductor layer and the $n^-$ semiconductor layer are GaAs layers.

3. The transistor structure of claim 1, wherein the first epitaxial region comprises a $p^+$ semiconductor layer.

4. The transistor structure of claim 3, wherein the $p^+$ semiconductor layer is a GaAs layer.

5. The transistor structure of claim 1, wherein a collector portion of the first transistor is placed at a distance from the emitter portion of the first transistor so that the first transistor has a DC current gain of at least 0.1.

6. The transistor structure of claim 1 wherein the emitter portion of the first transistor is electrically connected to a voltage source and the collector portion of the first transistor is electrically connected to a power amplifier circuit, so that the first transistor is configured as a switch between the voltage source and the power amplifier circuit.

7. The transistor structure of claim 6 wherein the switch has a shutdown current having a magnitude of less than approximately 1 μA.

8. The transistor structure of claim 6, wherein a collector portion of the first transistor is placed at a distance from the emitter portion of the first transistor so that the first transistor has a DC current gain of at least 0.1.

9. The transistor structure of claim 1, wherein the first epitaxial region further serves as a collector portion of the first transistor.

10. A transistor structure, comprising:
    a first lateral transistor having a base portion and an emitter portion; and
    a second vertical transistor having a base and a collector:
    wherein a first epitaxial region:
       serves both as the emitter portion of the first transistor and as the base of the second transistor, and
       forms a heterojunction with an emitter of the second transistor; and
    wherein a second epitaxial region serves both as the base portion of the first transistor and as the collector of the second transistor; and
    wherein the emitter of the second transistor further comprises an $n^-$ semiconductor layer and an $n^+$ semiconductor layer.

11. The transistor structure of claim 10 wherein the emitter portion of the first transistor is electrically isolated from the base of the second transistor, and wherein the base portion of the first transistor is electrically isolated from the collector of the second transistor.

12. The transistor structure of claim 10 wherein the base portion of the first transistor further comprises an $n^+$ semiconductor layer and an $n^-$ semiconductor layer.

13. The transistor structure of claim 10, wherein the emitter portion of the first transistor further comprises a $p^+$ semiconductor layer.

14. The transistor structure of claim 10, wherein a collector portion of the first transistor is placed at a distance from the emitter portion of the first transistor so that the first transistor has a DC current gain of at least 0.1.

15. A semiconductor device, comprising:
    a first $n^+$ semiconductor layer;
    a second $n^-$ semiconductor layer fabricated upon the first $n^+$ semiconductor layer, with the second $n^-$ semiconductor layer etched to form both a base portion of a lateral transistor and a collector of a vertical transistor; and
    a third $p^+$ semiconductor layer fabricated upon the second $n^-$ semiconductor layer, and having a first portion placed at a distance from a second portion, with the third $p^+$ semiconductor layer etched to form both an emitter portion of the lateral transistor and a base of the vertical transistor;
    wherein the base of the vertical transistor forms a heterojunction with an emitter of the second vertical transistor.

16. The semiconductor device of claim 15, wherein:
    the first $n^+$ semiconductor layer and the second $n^-$ semiconductor layer are configured as a base of a first transistor and as a collector of a second transistor;
    the first portion of the third $p^+$ semiconductor layer is configured as a collector of the first transistor; and
    the second portion of the third $p^+$ semiconductor layer is configured as an emitter of the first transistor.

17. The semiconductor device of claim 16 wherein the first transistor is a homojunction bipolar junction transistor, and the second transistor is a heterogeneous bipolar junction transistor.

18. The semiconductor device of claim 16 wherein the distance has a magnitude corresponding to a DC current gain of the first transistor, and wherein the DC current gain is at least 0.1.

19. The semiconductor device of claim 16 further comprising a switch circuit including the first transistor, the switch circuit configured to control a voltage between a voltage source and a power amplifier circuit according to a shutdown current, wherein:
the first portion is electrically connected to the power amplifier circuit;
the second portion is electrically connected to the voltage source, so that the first transistor is configured as a switch between the voltage source and the power amplifier circuit; and
the magnitude of the shutdown current is less than approximately 1 μA.

20. The semiconductor device of claim 16, further comprising:
a fourth $N^-$ semiconductor layer fabricated upon the third $p^+$ semiconductor layer; and
a fifth $n^+$ semiconductor layer fabricated upon the fourth $n^-$ semiconductor layer.

21. The semiconductor device of claim 18, wherein:
at least one of the first portion and the second portion is configured as a base of the first transistor; and
the fourth $N^-$ semiconductor layer and the fifth $n^+$ semiconductor layer are configured as an emitter of the second transistor.

22. The semiconductor device of claim 16 wherein:
the first $n^+$ semiconductor layer has a first portion and a second portion electrically isolated from the first portion;
the second $n^-$ semiconductor layer has a first portion and a second portion electrically isolated from the first portion;
the third $p^+$ semiconductor layer has a third portion electrically isolated from its first portion and its second portion;
the first portion of the first $n^+$ semiconductor layer and the first portion of the second $n^-$ semiconductor layer are configured as the base of the first transistor;
the second portion of the first $n^+$ semiconductor layer and the second portion of the second $n^-$ semiconductor layer are configured as the collector of the second transistor; and
the third portion of the third $p^+$ semiconductor layer is configured as a base of the second transistor.

23. The semiconductor device of claim 15 wherein the first $n^+$ semiconductor layer, the second $n^+$ semiconductor layer, and the third $p^+$ semiconductor layer are GaAs layers.

24. A switch circuit, comprising:
a first terminal configured for electrical connection to a voltage source;
a second terminal configured for electrical connection to a rower amplifier;
a first lateral switch transistor configured to control an application of a voltage from the voltage source to the power amplifier according to a switch signal; and
a second vertical switch transistor configured to control an application of the switch signal to the first switch transistor according to a shutdown current:
wherein at least one n-doped semiconductor layer comprises a base of the first switch transistor and a collector of the second transistor:
wherein a p-doped semiconductor layer comprises a collector and an emitter of the first switch transistor, and a base of the second switch transistor; and
wherein the base of the second switch transistor forms a heterojunction with an emitter of the second switch transistor:
wherein the at least one n-doped semiconductor layer further comprises a first semiconductor layer that is an $n^+$ semiconductor layer, and a second semiconductor layer that is an $n^-$ semiconductor layer.

25. The switch circuit of claim 24, wherein
the first switch transistor has an emitter terminal connected to the first terminal, a collector terminal connected to the second terminal, and a base terminal; and
the second switch transistor has a collector terminal in electrical communication with the first terminal through a resistor and in electrical communication with the base terminal of the first switch transistor, a grounded emitter terminal, and a base terminal configured to receive the shutdown current.

26. The switch circuit of claim 24 wherein the $n^+$ semiconductor layer and the $n^-$ semiconductor layer are GaAs layers.

27. The switch circuit of claim 24 wherein the p-doped semiconductor layer is a $p^+$ semiconductor layer.

28. The switch circuit of claim 27 wherein the $p^+$ semiconductor layer is a GaAs layer.

29. The switch circuit of claim 24 wherein the first switch transistor is a bipolar junction transistor.

* * * * *